United States Patent [19]

Ward

[11] Patent Number: 4,705,956
[45] Date of Patent: Nov. 10, 1987

[54] ELECTRON IMAGE PROJECTOR
[75] Inventor: Rodney Ward, Crawley, England
[73] Assignee: U.S. Philips Corporation, New York, N.Y.
[21] Appl. No.: 716,413
[22] Filed: Mar. 27, 1985
[30] Foreign Application Priority Data Apr. 2, 1984 [GB] United Kingdom ............... 8408479

[51] Int. Cl.⁴ .......................................... H01J 37/00
[52] U.S. Cl. ............................ 250/492.2; 250/491.1
[58] Field of Search ....................... 250/492.2, 491.1; 219/121 EW, 121 EL

[56] References Cited

U.S. PATENT DOCUMENTS

| | | | |
|---|---|---|---|
| 3,849,659 | 11/1974 | O'Keefe | 250/492.2 |
| 3,887,811 | 6/1975 | Livesay | 250/492.2 |
| 4,370,554 | 1/1983 | Bohlen et al. | 250/491.1 |
| 4,469,949 | 9/1984 | Mori et al. | 250/491.1 |
| 4,503,334 | 3/1985 | King et al. | 250/491.1 |
| 4,528,452 | 7/1985 | Livesay | 250/492.2 |
| 4,554,458 | 11/1985 | Behringer et al. | 250/492.2 |

FOREIGN PATENT DOCUMENTS 2700357 7/1978 Fed. Rep. of Germany ... 250/492.2

Primary Examiner—Bruce C. Anderson
Attorney, Agent, or Firm—J. C. Fox

[57] ABSTRACT

A step-and-repeat electron image projector for transferring mask patterns repeatedly from a photoemissive cathode reticle (1) onto a target (3) with high resolution capabilities. Accelerated by a uniform electric field E and focussed by a uniform magnetic field H, a patterned electron beam is projected from the reticle (1) onto an area of the target with unity magnification. The electric field E is established between the cathode reticle and an electron permeable anode grid (2) situated between the cathode reticle and the target. Alignment of the beam and the target is effected by detecting electrons backscattered from reference markers (30) on the target with a backscattered electron detector (D) being located between the grid and the target. After exposing one area, the target is moved stepwise on an X-Y table (100) to expose an adjacent area, this procedure being repeated until the entire target has been exposed.

5 Claims, 2 Drawing Figures

ELECTRON IMAGE PROJECTOR

BACKGROUND OF THE INVENTION

This invention relates to an electron image projector for projecting with substantially unity magnification a beam of electrons emitted by a cathode onto a target under the action of substantially uniform electric and magnetic fields, wherein the beam of electrons has a predetermined spatial pattern extending transversely to the electric field.

An electron image projector may be used in the manufacture of high resolution semiconductor devices for defining lithographically a pattern in an electron sensitive resist layer provided on a semiconductor wafer substrate. The patterned electron beam emitted by the cathode is projected onto the resist layer to define therein a pattern reproducing the pattern of the electron beam. After exposure the resist is developed and the patterned resist layer thus formed is used as a stencil during subsequent processing of the semiconductor wafer to form the device in question.

An electron image projector for entire wafer exposure and having the features mentioned in the opening paragraph is known, for example, from the paper by J. P. Scott entitled "1:1 Electron Image Projector" which appeared in Solid State Technology, May 1977, pages 43 to 47. The main advantages of this electron image projector can be summarized as fast exposure times and high resolution capability.

In the fabrication of integrated circuits, it is necessary to expose the semiconductor wafer to a respective pattern at several different lithographic stages. In order to ensure accurate registration of the patterns it is important to determine at each exposure the exact disposition of the wafer relative to the projected pattern. In the known 1:1 electron image projector the markers on the wafer are formed from tantalum oxide and are detected by the X-radiation they emit when irradiated by corresponding portions of the electron beam. Unfortunately, the efficiency of X-ray generation is low. Moreover, in order not to perturb the electric field the X-rays have to be detected on the side of the wafer remote from the cathode and hence they suffer significant attenuation before they are detected. In consequence the X-ray signal is very weak and the reference marker on the wafer has to be made relatively large to compensate. In order to have full alignment capabilities it is essential to have at least two reference markers spaced apart on the wafer. However in view of their large size and in order not to waste useful area of the semiconductor wafer it is in practice not feasible to employ more than two such markers on a 4 inch diameter wafer. With only two markers it is not possible to compensate for location distortions and it is therefore difficult to ensure good registration over the entire wafer. In other words the known 1:1 entire wafer electron image projector is not able to make full use of its high resolution capabilities because performance is limited by overlay errors.

A further disadvantage of the known 1:1 electron image projector is that the target, i.e. the resist coated wafer, constitutes an anode and in operation a large potential difference (typically 20 kV) is applied between the cathode and the anode to establish the electric field under the action of which the electron beam is projected from the cathode onto the target. This imposes stringent planarity requirements on the wafer in order not to distort unduly the electric field—and hence the electron trajectories—in the vicinity of the target. Inevitably the electric field will suffer some distortion at the periphery of the wafer. This can be a problem, especially if the wafer is held on the type of electrostatic chuck shown in FIG. 4 of the aforementioned paper by J. P. Scott, in which an overlapping lip is present at the surface of the wafer facing the cathode. In this case it is necessary to locate the wafer with great precision for each subsequent exposure in the image projector in order to obtain optimum registration.

A modified electron image projector which has the advantage that the dependence of the electron trajectories on the shape and/or disposition of the target can be reduced is disclosed in our co-pending (as yet unpublished) European Patent Application No. 84201263.5, corresponding to U.S. application Ser. No. 645,881, filed Aug. 30, 1984, now abandoned, and its continuation U.S. application Ser. No. 883,007, filed July 7, 1986. This modified electron image projector has a novel anode comprising a grid with an array of electron permeable regions, which array is at least as extensive as the spatial pattern of electrons emitted by the cathode. The grid is disposed between and parallel to the cathode and the target. In operation a substantially uniform electric field is produced between the cathode and the grid. Means are provided for producing a substantially uniform magnetic field parallel to the electric field to focus the patterned beam of electrons onto the target. Instead of an X-ray alignment facility, a backscattered electron detector is disposed generally between the grid and the target outside the region occupied by the projected electrons. The output of the detector is used to control the alignment of the projected beam with the wafer.

It is noted that backscattered electrons are much more readily detectable than X-rays used in a conventional electron image projector, particularly because the efficiency of their generation is some five orders of magnitude greater than that of X-rays.

SUMMARY OF THE INVENTION

According to the present invention there is provided an electron image projector for projecting with substantially unity magnification a beam of electrons emitted by a cathode onto a target under the action of a substantially uniform electric field wherein the beam of electrons has a predetermined spatial pattern which extends transversely to the electric field, the projector comprising an electron emissive cathode, an anode comprising a grid having an array of electron permeable regions, the array being at least as extensive as the spatial pattern, which grid is disposed intermediate and parallel to the cathode and the target whereby in operation the electric field is produced between the cathode and the anode grid, the projector further comprising means for producing a substantially uniform magnetic field parallel to the electric field to focus the patterned beam of electrons onto the target, means disposed generally between the grid and the target for detecting electrons backscattered from reference markers on the target, and means for moving the target incrementally in its own plane relative to the cathode.

In this electron image projector alignment is effected by detecting electrons backscattered from the reference markers on the target. As mentioned previously the generation of backscattered electrons is far more efficient than X-ray generation and therefore the reference markers can be substantially smaller. In consequence a greater number of markers may be employed at more locations without unduly wasting useful target area. The target can therefore be divided notionally into a plurality of areas or 'fields' at each of which the same pattern is to be formed with a pair of spaced apart reference markers being associated with each such field. When a plurality of similar semiconductor devices such as integrated circuits are to be made on a single semiconductor wafer (ie the target) the markers may be so small that they can readily be located in the so-called 'scribe lanes' between adjacent integrated circuit devices to that they do not occupy useful wafer area. It is noted here that a field does not necessarily correspond to the area occupied by a single integrated circuit device, but may contain only a part of a single integrated circuit or, alternatively several similar or different integrated circuit devices. The electron image projector of the present invention also comprises means for moving the target (in this case the semiconductor wafer) incrementally in its own plane relative to the cathode whereby each field can be exposed to the beam of electrons in turn until the entire wafer has been exposed. Because each field has an associated pair of reference markers as mentioned above alignment can be effected on a field by field basis thereby minimizing the effect of local distortions and consequently improving registration accuracy.

Because the field size can be small compared with the entire target area it becomes feasible, indeed preferable, to use an electromagnet for providing the magnetic field rather than air-cored solenoids which are used in the prior art electron image projectors referenced above. The electromagnet may have two ferromagnetic pole pieces betwen which are disposed the cathode, the anode grid, and the location for the target. Each of the pole pieces suitably has a respective solenoid wound around it and in order to ensure maximum field uniformity in the region between the cathode and the area of the target to be exposed the cross-sectional area of the pole pieces should be greater than the cathode.

In order to facilitate distinguishing electrons backscattered from the reference markers and electrons backscattered from other features which may be present on the target the electron image projector may comprise a removable screen between the anode grid and the target. For its major part the screen is substantially impermeable to electrons, but has an electron permeable portion corresponding to the reference markers on the target. Thus, in operation the screen is moved into position between the grid and the target for an initial alignment stage before being removed to expose the entire target. Alternatively, there may be provided between the grid and the target means for modulating a portion of the beam of electrons corresponding to the reference markers on the target. In this case alignment is effected during the initial stage of exposure and simultaneously therewith.

BRIEF DESCRIPTION OF THE DRAWING

An embodiment of the invention will now be described with reference to the accompanying drawing in which.

DESCRIPTION OF THE PREFERRED EMBODIMENT

It is noted that, for the sake of the clarity, elements of the drawings are not to scale.

The electron image projector shown in the Figures comprises a photocathode reticle 1 and a target 3 onto which a patterned electron beam can be projected from the reticle 1 under the action of a uniform electric field as described in more detail below. The target 3 is parallel to the reticle 1. A grid 2 is disposed intermediate and with its major surfaces parallel to the reticle 1 and the target 3. The photocathode reticle 1, the grid 2, and the target 3 are enclosed within a vacuum chamber 8 in which a low pressure of, for example, $10^{-5}$ Torr, is maintained during operation.

Figure 1:
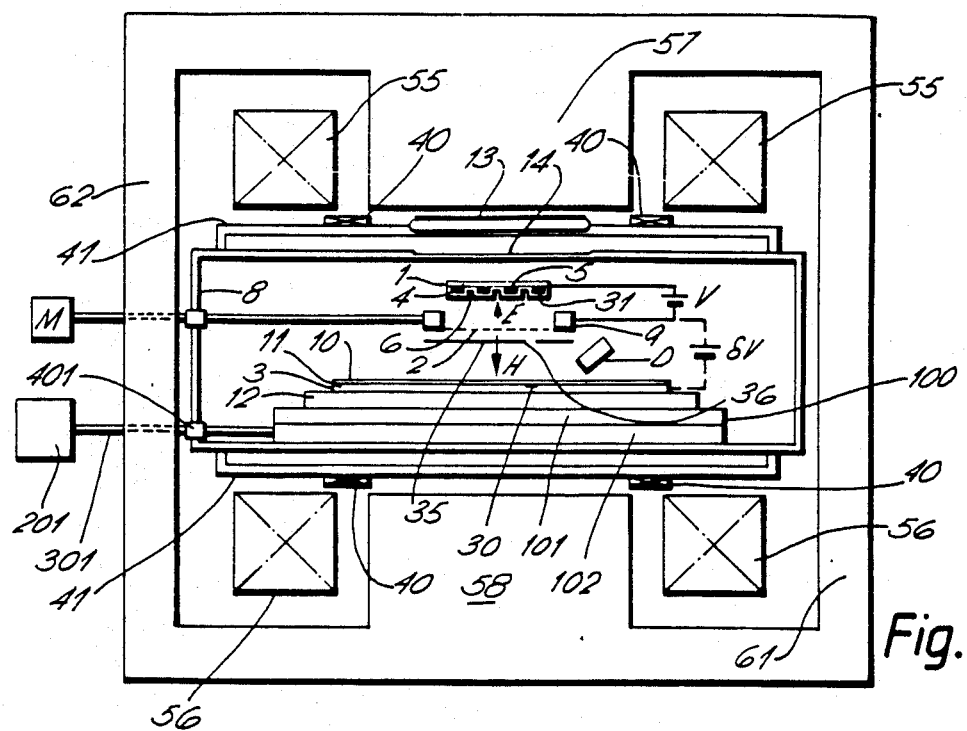
FIG.1 is a schematic sectional view of an electron image projector in accordance with the invention taken on the line I-I' of FIG. 2.
Figure 2:
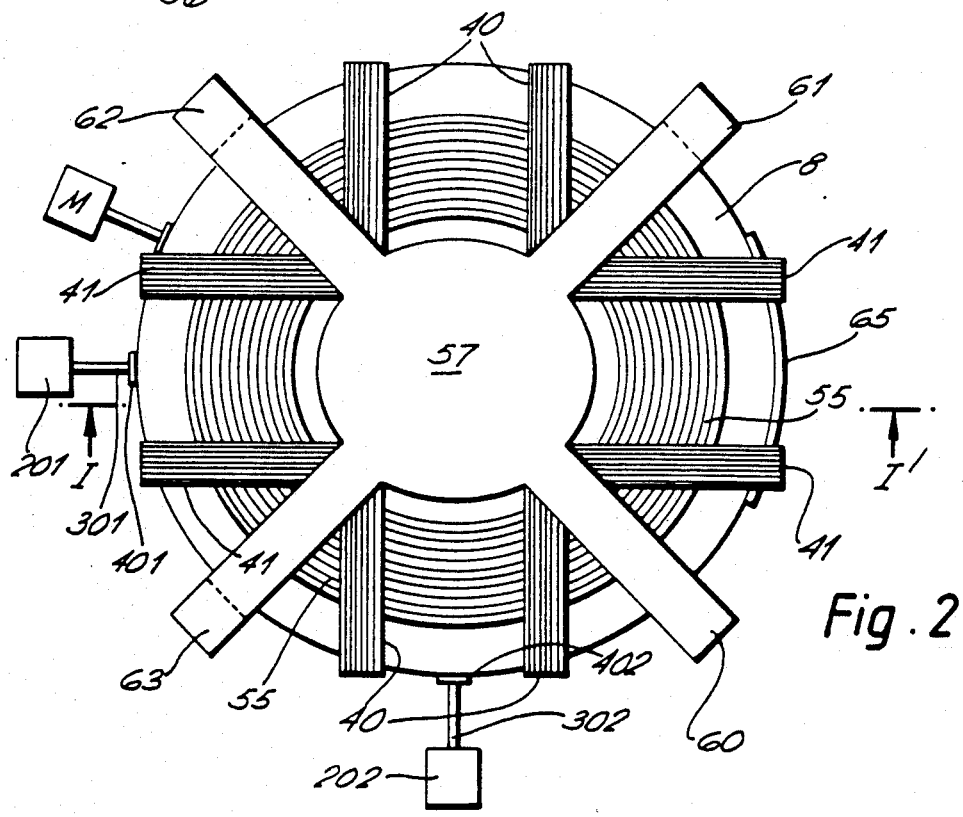
FIG. 2 is a plan view of the electron image projector of FIG. 1.

The photocathode reticle 1 comprises a circular quartz plate 4 which may be, for example 50 mm in diameter and 2 mm thick but it is noted here that the reticle size can be chosen to suit the particular target area to be exposed. A patterned layer 5 of material opaque to ultraviolet radiation, for example 1000 angstrom thick chromium layer is present on the surface 7 of the plate 4 facing the grid 2. A continuous photoemissive layer 6, for example a layer of 200 angstroms thick, covers the patterned opaque layer and the exposed areas of the surface. In order to avoid charging effects a thin continuous conducting layer, for example a layer of chromium 200 angstroms thick, is provided on the patterned opaque layer 5 and on the exposed parts of the plate 4. For the sake of clarity this conducting chromium layer, which is so thin as to be optically transparent, is not shown in FIG. 1.

The grid 2 constitutes an anode to which a potential can be applied for establishing a uniform electric field between the grid 2 and the reticle 1 as discussed in more detail below. The grid 2 is both electrically conductive and non-magnetic, and consists of a regular array of alternatively relatively electron-permeable and relatively electron-impermeable regions. The array is at least as extensive as the pattern of the electron beam. The grid 2 is formed, for example, by (1) a thin apertured copper sheet, (2) an apertured thin sheet of plastics coated with a conductive layer, (3) an apertured silicon wafer, (4) a glass channel plate, or (5) an apertured sheet of photo-etchable glass provided with a metallization at one major surface. These forms of grid are described in more detail in our co-pending European Patent Application No. 84201263.5, corresponding to U.S. application Ser. No. 645,881, filed Aug. 30, 1984, now abandoned, and its continuation U.S. application Ser. No. 883,007, filed July 7, 1986, to which reference is invited. The grid is mounted on an electrically conductive ring 9 which is supported in the projector as described in the aforementioned European Patent Application and which can be moved in its own plane by moving means M.

The target 3 comprises an electron sensitive resist layer 10 on a semiconductor wafer 11 which may be 100 mm in diameter and which is held by a chuck 12, for example an electrostatic chuck as disclosed in our British Patent GB No. 1,443,215 or our European Patent Application EP No. 0,074,691. The chuck 12 is carried on a non-magnetic X-Y table 100 made for example essentially of aluminum. The X-Y table comprises an X-stage 101 and a Y-stage 102 driven independently by respective stepping motors 201 and 202 located outside the vacuum chamber 8. The respective drive shafts 301, 302 of the stepping motors 201, 202 enter the vacuum chamber through vacuum seals 401, 402 respectively in known manner.

An ultraviolet lamp 13 is situated outside the vacuum chamber 8 and is operable to illuminate the surface of the reticle 1 remote from the grid 2. The ultraviolet radiation reaches the reticle 1 via a window 14 in the vacuum chamber 8.

In operation a large potential difference V of, for example, 20 kV is applied between the reticle 1 and the grid 2 (via ring 9) to establish a uniform electric field E therebetween. Under the action of this electric field E electrons emitted from portions of the photoemissive layer 6 which do not overlie the patterned opaque layer 5 and which therefore are exposed to radiation from the lamp 13 are projected to the anode grid 2 as a beam of electrons having a spatial pattern which extends transversely to the pattern of the reticle 1 determined by those portions of the photoemissive layer 6 where the patterned opaque layer 5 is not present.

A substantially uniform magentic field H for focussing the patterned electron beam is produced by an electromagnet comprising two iron cored solenoids 55,56. The solenoids 55,56 surround iron pole pieces 57,58 respectively. The pole pieces 57,58 are circular in cross section with a diameter of approximately 200 mm. This cross-sectional area of the pole pieces 57,58 is substantially greater than the reticle 1. The gap between the pole pieces is for example approximately 200 mm and the vacuum chamber 8 is diposed in the gap with the reticle 1 and the grid 2 centrally disposed with respect to the pole pieces 57,58. Four equally spaced ferromagnetic bars 60,61,62,63 which constitute the yoke of the electromagnet extend between the pole pieces 57,58 to form a frame around the vacuum chamber 8. The space between the bars allows access to the vacuum chamber 8, e.g. for loading the semiconductor wafer through the entry port 65 in a side wall of the vacuum chamber 8.

The magnetic field H is parallel to the electric field E and is uniform at least in the whole region between the reticle 1 and the area of the target 3 to be exposed. The strength of the magnetic field H may, for example, be 180 kAm$^{-1}$.

The spacing between the reticle 1 and the anode grid 2 is selected to be such that the surface of the grid 2 facing the reticle 1 is located substantially in coincidence with the first magnetic focus in relation to the cathode as explained in more detail in our copending Patent Application mentioned above and to which reference is again invited. A focused electron image is thus formed substantially at the surface of the grid facing the cathode, i.e. in the entrance plane of the grid.

Electrons which are able to pass through the apertures or electron-permeable regions of the grid 2 enter the region between the grid 2 and the target 3. Preferably there is no potential difference between the target 3 an the grid 2 so that the resist coated semiconductor wafer 11 is held at the same potential V as the grid 2. However, to correct for small inaccuracies, a small voltage V which is much less than the projecting voltage V, for example a few per cent or less, and not more than about 5% thereof, may be applied between the grid 2 and the target 3 as represented by the borken line in FIG. 1 to ensure tha the patterned electron beam is correctly focussed in the target plane.

Having passed through the grid 2, the electrons of the beam still under the influence of the magnetic field H continue to travel substantially at the same velocity at which they enter the grid 2 until they impinge on the resist layer 10 present on the semiconductor wafer 11. The resist coated semiconductor wafer is located at the second magnetic focus in relation the reticle 1. Since the velocity of the electrons between the grid 2 and the target 3 is substantially twice the average of their velocity between the reticle 1 and the grid 2, the spacing of the target 3 from the grid 2 may be substantially twice the spacing of the grid 2 from the reticle 1. With the magnetic and electric field strengths given here, i.e. 180 kAm$^{-1}$ and 20 kV respectively, the spacing may be 7 mm between the reticle 1 and the grid 2, and 14 mm between the grid 2 and the target 3.

Thus a first area of the resist covered wafer 11 corresponding to the area of the patterned electron beam can be exposed. With a reticle having a patterned area of 25 mm square the exposed area (i.e the field size) will also be a 25 mm square. After one exposure the wafer 11 is moved stepwise in its own plane on the X-Y table 100 to expose an adjacent area to the electron beam, this step and expose procedure being repeated until the whole wafer has been exposed.

At each exposure it is important to ensure that the electron beam is correctly aligned with the target. For this purpose reference markers (shown schematically as region 30 in FIG. 1) are provided on the target. These reference markers may be formed from, for example, silicon dioxide bars or may consist of topographical features, particularly pits, formed at the surface of the semiconductor wafer and preferably in the scribe lanes. In particular the reference markers may comprise a pair of 50 $\mu$m squares located one in each of the X- and Y-scribe lanes (which typically are 100 $\mu$m wide). Corresponding reference markers (represented schematically as region 31 in FIG. 1) are provided on the reticle 1. The location of the reference markers on the target may be ascertained by detecting electrons backscattered therefrom using an electron detector D positioned between the grid 2 and the target 3 outside the region occupied by the electron beam. The output of the detector D is used to control the alignment of the projected electron beam with the wafer by magnetic deflection using two pairs of orthogonal deflection coils 40, 41 in known manner or, alternatively, by electrostatic deflection using electrostatic deflection plates between the grid and the target as disclosed in our copending (as yet unpublished) British Patent Application No. 8325670, corresponding to U.S. application Ser. No. 654,536, filed Sept. 26, 1984.

For the alignment operation there is introduced between the grid 2 and the target 3 a removeable apertured screen 35 made for example of aluminum. For the major part the screen is impermeable to electrons but has apertures 36 corresponding to the reference markers 30 on the target. The use of such a screen 35 facilitates detection of electrons backscattered only in the vicinity of the reference markers 30. Otherwise there is the problem of interference caused by electrons backscattered from other features which are present ordinarily on the target. The screen is removed after alignment has been completed so that exposure can proceed.

An alternative solution to the problem of distinguishing electrons backscattered only in the vicinity of the reference markers is to include between the grid and the target, instead of a screen, means for modulating a portion of the electron beam corresponding to the reference markers on the target, the remainder of the beam remaining undisturbed. For this purpose electrostatic deflection plates may be employed between the grid and the target as mentioned above. The use of such electrostatic plates for modulating a portion of the beam in this way is explained fully in our copending British Patent Application No. 8325670, corresponding to U.S. application Ser. No. 654,436, filed Sept. 26, 1984. Phase sensitive detection can then be used to analyse the signals from the electron detector in known manner. In this case alignment can be effected during—and simultaneously with—the initial stage of exposure.

The grid 2 is moved in its own plane during exposure so that the pattern produced on the target 3 reproduces the pattern of the electron beam without reproducing the array of the grid. A suitable mounting which permits the grid to move such that it remains accurately parallel to the reticle 1 and at a constant distance therefrom is described in our copending European Patent Application No. 84201263.5 mentioned above. The movement of the grid may be effected pneumatically, either from outside the vacuum chamber via bellows, or with one or more Bourdon tubes within the chamber (not shown in the Figures).

In view of the above description it will be evident that many modifications may be made within the scope of the invention. As an example it is noted that instead of using an iron-cored electromagnet, a superconducting magnet comprising superconducting coils mounted in cryostats may be used to provide an intense and stable magnetic field with high uniformity to focus the electrons from the cathode reticle onto the target.

What is claimed is:

1. An electron image projector for projecting with substantially unity magnification a beam of electrons emitted by a cathode onto a target under the action of an electric field, the projector comprising:
    (a) an electron emissive cathode for emitting a beam of electrons having a predetermined spatial pattern,
    (b) a target holder spaced from and disposed parallel to the cathode,
    (c) an anode comprising a grid having an array of electron permeable regions, the array being at least as extensive as the spatial pattern, which grid is spaced from and disposed intermediate and parallel to the cathode and the target holder,
    (d) a vacuum chamber surrounding the cathode, the anode grid and the target,
    (e) means for producing a substantially uniform electric field between the cathode and the anode grid,
    (f) means for producing a substantially uniform magnetic field parallel to the electric field to focus the beam pattern onto the target,
    (g) means disposed generally adjacent to the space between the grid and the target holder for detecting electrons back scattered from reference markers on the target, and
    (h) means for moving the target incrementally in its own plane relative to the cathode,
characterized in that the means for producing the magnetic field comprises: an electromagnet having two ferromagnetic pole pieces, each of the pole pieces having a cross-sectional area greater than that of the cathode and each of the pole pieces surrounded by a respective solenoid;
and further characterized in that the vacuum chamber containing the cathode, the anode grid and the target holder is disposed between these pole pieces, the vacuum chamber framed by yoke means extending between the two pole pieces, the yoke means comprising a plurality of spaced apart bars allowing access to the vacuum chamber.

2. An electron image projector as claimed in claim 1 in which the means for moving the target includes means for movement in two orthogonal directions.

3. An electron image projector as claimed in claim 1 in which the means for moving the target comprises a non-magnetic table.

4. An electron image projector as claimed in claim 1 in which a removable electron impermeable screen having an electron permeable portion corresponding to the reference markers on the target is disposed between the anode grid and the target.

5. An electron image projector as claimed in claim 1 in which means for modulating a portion of the beam of electrons corresponding to the reference markers on the target is disposed between the anode grid and the target holder.

* * * * *